(12) United States Patent
Chang et al.

(10) Patent No.: US 11,289,430 B2
(45) Date of Patent: Mar. 29, 2022

(54) SEMICONDUCTOR PACKAGE AND A METHOD FOR MANUFACTURING THE SAME

(71) Applicant: Samsung Electronics Co., Ltd., Suwon-si (KR)

(72) Inventors: Won-Gi Chang, Hwaseong-si (KR); Bok Sik Myung, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/835,884

(22) Filed: Mar. 31, 2020

(65) Prior Publication Data

US 2021/0050309 A1    Feb. 18, 2021

(30) Foreign Application Priority Data

Aug. 13, 2019    (KR) .................. 10-2019-0098779

(51) Int. Cl.
| | | |
|---|---|---|
| *H01L 23/00* | (2006.01) | |
| *H01L 23/31* | (2006.01) | |
| *H01L 23/498* | (2006.01) | |
| *H01L 21/48* | (2006.01) | |
| *H01L 21/56* | (2006.01) | |
| *H01L 21/78* | (2006.01) | |
| *H01L 25/065* | (2006.01) | |
| *H01L 25/18* | (2006.01) | |

(52) U.S. Cl.
CPC ........ *H01L 23/562* (2013.01); *H01L 21/4853* (2013.01); *H01L 21/4857* (2013.01); *H01L 21/561* (2013.01); *H01L 21/565* (2013.01); *H01L 21/78* (2013.01); *H01L 23/3128* (2013.01); *H01L 23/49822* (2013.01); *H01L 23/49838* (2013.01); *H01L 24/48* (2013.01); *H01L 25/0652* (2013.01); *H01L 25/0657* (2013.01); *H01L 25/18* (2013.01); *H01L 2224/48227* (2013.01); *H01L 2225/0651* (2013.01); *H01L 2225/06506* (2013.01); *H01L 2225/06562* (2013.01); *H01L 2225/06586* (2013.01); *H01L 2924/1431* (2013.01); *H01L 2924/1434* (2013.01); *H01L 2924/3511* (2013.01)

(58) Field of Classification Search
CPC ..................... H01L 25/0652; H01L 25/0657
See application file for complete search history.

(56) References Cited

U.S. PATENT DOCUMENTS

| | | |
|---|---|---|
| 8,129,828 B2 | 3/2012 | Maeda |
| 8,410,375 B2 | 4/2013 | Matsushita et al. |
| 8,895,358 B2 | 11/2014 | Lin |
| 9,085,826 B2 | 7/2015 | Ajoian |
| 9,917,025 B2 | 3/2018 | Noda et al. |

(Continued)

*Primary Examiner* — Yu-Hsi D Sun
(74) *Attorney, Agent, or Firm* — Harness, Dickey & Pierce, P.L.C.

(57) ABSTRACT

A semiconductor package may include a package substrate, a support structure on the package substrate and having a cavity therein, and at least one first semiconductor chip on the package substrate in the cavity. The support structure may have a first inner sidewall facing the cavity, a first top surface, and a first inclined surface connecting the first inner sidewall and the first top surface. The first inclined surface may be inclined with respect to a top surface of the at least one first semiconductor chip.

19 Claims, 18 Drawing Sheets

(56) References Cited

U.S. PATENT DOCUMENTS

| | | |
|---|---|---|
| 9,992,880 B2 | 6/2018 | Yu et al. |
| 10,299,373 B2 | 5/2019 | Lee et al. |
| 2012/0018869 A1* | 1/2012 | Kolan ................. H01L 23/3128 257/690 |
| 2019/0131242 A1 | 5/2019 | Lee et al. |

* cited by examiner

SEMICONDUCTOR PACKAGE AND A METHOD FOR MANUFACTURING THE SAME

CROSS-REFERENCE TO RELATED APPLICATION

This U.S. non-provisional patent application claims priority under 35 U.S.C. § 119 to Korean Patent Application No. 10-2019-0098779, filed on Aug. 13, 2019, in the Korean Intellectual Property Office, the disclosure of which is hereby incorporated by reference in its entirety.

BACKGROUND

Embodiments of the inventive concepts relate to a semiconductor package and a method for manufacturing the same.

An integrated circuit chip may be realized in the form of a semiconductor package so as to be appropriately applied to an electronic product. In a typical semiconductor package, a semiconductor chip may be mounted on a printed circuit board (PCB) and may be electrically connected to the PCB through bonding wires or bumps. For efficiency, a plurality of integrated circuit chips (or semiconductor chips) may be mounted on a large-area board to manufacture a plurality of semiconductor packages at the same time, and then, a singulation process of sawing a molding layer and the board may be performed to separate the semiconductor packages from each other.

Higher-performance, higher-speed and smaller electronic components have been increasingly demanded with the development of an electronic industry. To achieve these demands, thicknesses of the integrated circuit chip and the printed circuit board have been reduced.

SUMMARY

Embodiments of the inventive concepts may provide a semiconductor package with improved structural stability and a method for manufacturing the same.

Embodiments of the inventive concepts may also provide a method for manufacturing a semiconductor package, which is capable of reducing or minimizing defects or failure.

In an aspect, a semiconductor package may include a package substrate, a support structure on the package substrate and having a cavity therein, and at least one first semiconductor chip on the package substrate in the cavity. The support structure may have a first inner sidewall facing the cavity, a first top surface, and a first inclined surface connecting the first inner sidewall and the first top surface. The first inclined surface may be inclined with respect to a top surface of the at least one first semiconductor chip.

In an aspect, a method for manufacturing a semiconductor package may include forming sacrificial structures spaced apart from each other on a substrate, forming a support layer covering the sacrificial structures on the substrate, performing an anisotropic etching process on the support layer to form recesses exposing top surfaces of the sacrificial structures, removing the sacrificial structures to form cavities in the support layer, disposing semiconductor chips in the cavities formed by the removing of the sacrificial structures, respectively, and forming a molding layer on the semiconductor chips.

In an aspect, a semiconductor package may include a package substrate including a central region and a peripheral region surrounding the central region, a semiconductor chip on the central region of the package substrate, a support structure on the peripheral region of the package substrate and surrounding at least two sidewalls of the semiconductor chip, a molding layer covering the semiconductor chip and the support structure on the package substrate and filling a space between the semiconductor chip and the support structure, and external terminals on a bottom surface of the package substrate. The sidewalls of the semiconductor chip may be perpendicular or substantially perpendicular to a top surface of the package substrate. A distance between the semiconductor chip and the support structure may be constant or substantially constant from the top surface of the package substrate to a specific height and may gradually increase from the specific height toward a top surface of the support structure.

BRIEF DESCRIPTION OF THE DRAWINGS

The inventive concepts will become more apparent in view of the attached drawings and accompanying detailed description.

DETAILED DESCRIPTION OF EMBODIMENTS

Semiconductor packages according to the inventive concepts will be described hereinafter with reference to the accompanying drawings.

Figure 1A:
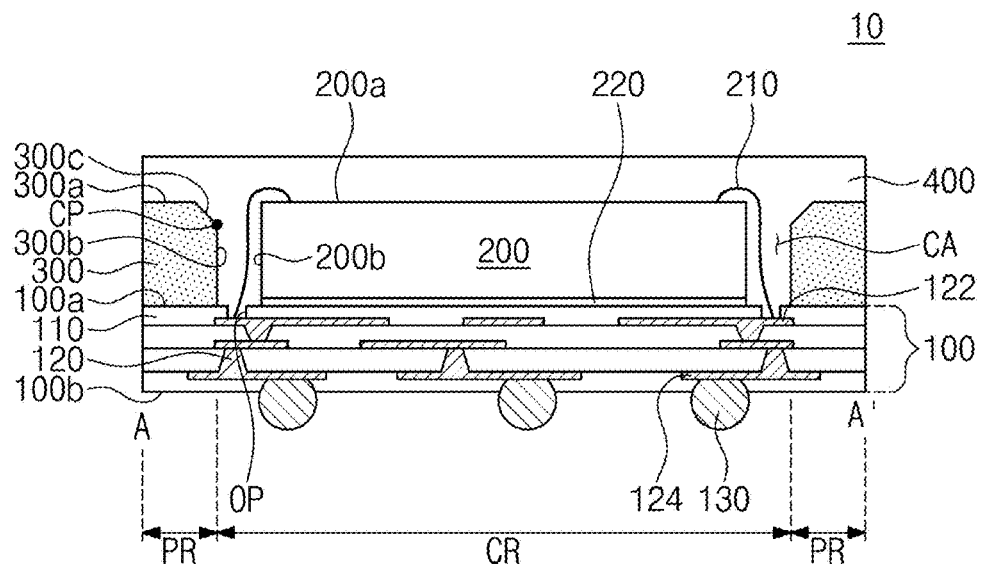
FIG. 1A is a cross-sectional view illustrating a semiconductor package according to some embodiments of the inventive concepts.
Figure 1B:
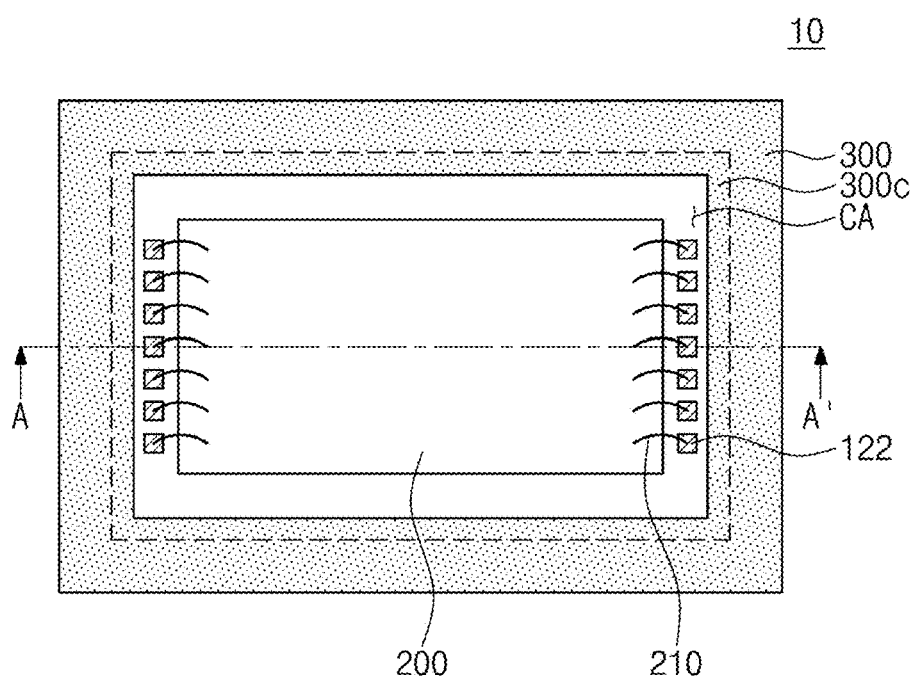
FIG. 1B is a plan view illustrating a semiconductor package according to some embodiments of the inventive concepts.

FIG. 1A is a cross-sectional view illustrating a semiconductor package according to some embodiments of the inventive concepts. FIG. 1B is a plan view illustrating a semiconductor package according to some embodiments of the inventive concepts. FIG. 1A corresponds to a cross-sectional view taken along a line A-A' of FIG. 1B.

Referring to FIGS. 1A and 1B, a semiconductor package 10 may include a package substrate 100, a first semiconductor chip 200, a support structure 300, and/or a molding layer 400.

The package substrate 100 may include a printed circuit board (PCB). Alternatively, the package substrate 100 may be a redistribution substrate having a circuit pattern. The package substrate 100 may have a structure in which insulating layers 110 and interconnection layers 120 are alternately stacked. For example, the stacked interconnection layers 120 may be connected to each other through a via penetrating the insulating layer 110 disposed therebetween. The interconnection layers 120 may be surrounded by the insulating layers 110. The insulating layers 110 may include a polymer material or may include an inorganic insulating material such as silicon oxide or silicon nitride. For example, the insulating layers 110 may include prepreg or a solder resist. The interconnection layers 120 may include a conductive material such as a metal. A total thickness of the package substrate 100 including the insulating layers 110 and the interconnection layers 120 may be greater than 10 μm and less than 80 μm.

The semiconductor package 10 may have a fan-out structure by the package substrate 100. A portion of the interconnection layers 120 may be exposed by an opening OP formed in the insulating layer 110 providing a top surface 100a of the package substrate 100 and may function as a substrate pad 122 on which the first semiconductor chip 200 is mounted. Another portion of the interconnection layers 120 may be exposed from the insulating layer 110 providing a bottom surface 100b of the package substrate 100 and may function as a terminal pad 124 to which an external terminal 130 is connected.

The package substrate 100 may include a central region CR and a peripheral region PR. The peripheral region PR may surround the central region CR when viewed in a plan view. Here, the central region CR may be a region of the package substrate 100, on which the first semiconductor chip 200 is mounted. For example, the substrate pads 122 of the package substrate 100 may be disposed in the central region CR.

The external terminal 130 may be provided on the bottom surface 100b of the package substrate 100. The external terminal 130 may include a solder ball or a solder pad. The semiconductor package 10 may have a ball grid array (BGA) form, a fine ball-grid array (FBGA) form, or a land grid array (LGA) form, in accordance with a kind of the external terminal 130. The external terminals 130 may be electrically connected to the interconnection layers 120 of the package substrate 100. In the present specification, it may be understood that when a component is electrically connected to another component, it may be connected directly or indirectly to the other component.

The first semiconductor chip 200 may be disposed on the package substrate 100. A bottom surface of the first semiconductor chip 200, which faces the package substrate 100, may be a back surface, and a top surface 200a of the first semiconductor chip 200 may be a front surface. In the present specification, the front surface may be a surface adjacent to an active surface of an integrated device in a semiconductor chip and may be defined as a surface on which pads of the semiconductor chip are formed. The back surface may be defined as another surface opposite to the front surface. The first semiconductor chip 200 may be mounted on the central region CR of the package substrate 100. The first semiconductor chip 200 may be mounted by a wire bonding method. The first semiconductor chip 200 may be electrically connected to the package substrate 100 through first bonding wires 210. The first bonding wires 210 may be connected to chip pads disposed on the front surface 200a of the first semiconductor chip 200 and may be connected to the substrate pads 122 of the package substrate 100 through the openings OP of the insulating layer 110 of the package substrate 100. The first semiconductor chip 200 may be electrically connected to the external terminals 130 through the package substrate 100. The first semiconductor chip 200 may be adhered to the insulating layer 110 of the package substrate 100 through a first adhesive layer 220.

In certain embodiments, the first semiconductor chip 200 may be mounted by a flip chip method. In example embodiments, a bottom surface of the first semiconductor chip 200 may be the front surface, and a top surface of the first semiconductor chip 200 may be the back surface. The first semiconductor chip 200 may be electrically connected to the package substrate 100 through chip terminals such as solder balls. The chip terminals may be provided between the first semiconductor chip 200 and the package substrate 100 so as to be connected to the chip pads of the front surface of the first semiconductor chip 200 and the substrate pads of the package substrate 100, respectively.

The first semiconductor chip 200 may be a logic chip or a memory chip. For example, the memory chip may be a DRAM chip, an NAND flash memory chip, an NOR flash memory chip, a PRAM chip, a ReRAM chip, or a MRAM chip. Alternatively, the first semiconductor chip 200 may be a non-memory chip such as an application processor.

The support structure 300 may be disposed on the package substrate 100. The support structure 300 may be disposed on the peripheral region PR. The support structure 300 may surround the central region CR along the peripheral region PR when viewed in a plan view. For example, the support structure 300 may have a cavity CA exposing the central region CR. A bottom surface of the support structure 300 may be in contact with the insulating layer 110 of the package substrate 100. The support structure 300 may support the package substrate 100 to inhibit or prevent the package substrate 100 from being deformed. For example, in a process of forming the semiconductor package 10, the support structure 300 may support the package substrate 100 from above to reduce or prevent the package substrate 100 having a thin thickness from being bent or warped. Thus, structural stability of the semiconductor package 10 may be improved. This will be described later in more detail in a method for manufacturing the semiconductor package 10. The support structure 300 may include an insulating material. For example, the support structure 300 may include an ajinomoto build-up film (ABF) or a resin-coated copper (RCC).

The support structure 300 may be disposed at sides of sidewalls 200b of the first semiconductor chip 200. For example, the first semiconductor chip 200 may be provided in the cavity CA of the support structure 300, and the support structure 300 may surround the first semiconductor chip 200 when viewed in a plan view. The support structure 300 may be spaced apart from the first semiconductor chip 200. When the first semiconductor chip 200 is mounted on the package substrate 100 by the wire bonding method, the first bonding wires 210 of the first semiconductor chip 200 may be spaced apart from the support structure 300 between the first semiconductor chip 200 and the support structure 300. A distance between an inner sidewall 300b of the support structure 300 and the first semiconductor chip 200 may range from 1 μm to 10 μm. However, embodiments of the inventive concepts are not limited thereto. In certain embodiments, the distance between the inner sidewall 300b of the support structure 300 and the first semiconductor chip 200 may be less than 1 μm or greater than 10 μm. A top surface 300a of the support structure 300 may be located at the same or substantially the same level as the top surface 200a of the first semiconductor chip 200. Alternatively, the top surface 300a of the support structure 300 may be higher or lower than the top surface 200a of the first semiconductor chip 200, unlike FIG. 1A.

The support structure 300 may have a first inclined surface 300c disposed between the top surface 300a and the inner sidewall 300b facing the first semiconductor chip 200. The first inclined surface 300c may connect the top surface 300a and the inner sidewall 300b of the support structure 300. The inner sidewall 300b of the support structure 300 may be perpendicular or substantially perpendicular to the top surface 100a of the package substrate 100, and the first inclined surface 300c may be inclined with respect to the inner sidewall 300b of the support structure 300. For example, the first inclined surface 300c may be inclined with respect to the top surface 100a of the package substrate 100 and the top surface 200a of the first semiconductor chip 200. A contact point CP of the inner sidewall 300b and the first inclined surface 300c of the support structure 300 may be located at a lower level than the top surface 200a of the first semiconductor chip 200. In other words, a first height at which the contact point CP of the inner sidewall 300b and the first inclined surface 300c of the support structure 300 is located may be between the top surface 200a and the bottom surface of the first semiconductor chip 200. Thus, a distance between the first semiconductor chip 200 and the support structure 300 may be constant or substantially constant from the top surface 100a of the package substrate 100 to the first height and may gradually increase from the first height toward the top surface 300a of the support structure 300. When the top surface 300a of the support structure 300 is higher than the top surface 200a of the first semiconductor chip 200 unlike FIG. 1A, the contact point CP of the inner sidewall 300b and the first inclined surface 300c of the support structure 300 may be located at a higher level than the top surface 200a of the first semiconductor chip 200. The first inclined surface 300c of the support structure 300 may surround the first semiconductor chip 200 when viewed in a plan view.

The molding layer 400 may be disposed on the package substrate 100. The molding layer 400 may cover the first semiconductor chip 200 and the support structure 300 on the central region CR and the peripheral region PR of the package substrate 100. The molding layer 400 may fill a space between the first semiconductor chip 200 and the support structure 300. The molding layer 400 may include an insulating polymer material such as an epoxy molding compound (EMC). Alternatively, the molding layer 400 may include an insulating polymer (e.g., an epoxy-based polymer), an organic material, or an inorganic material.

Figure 2A:
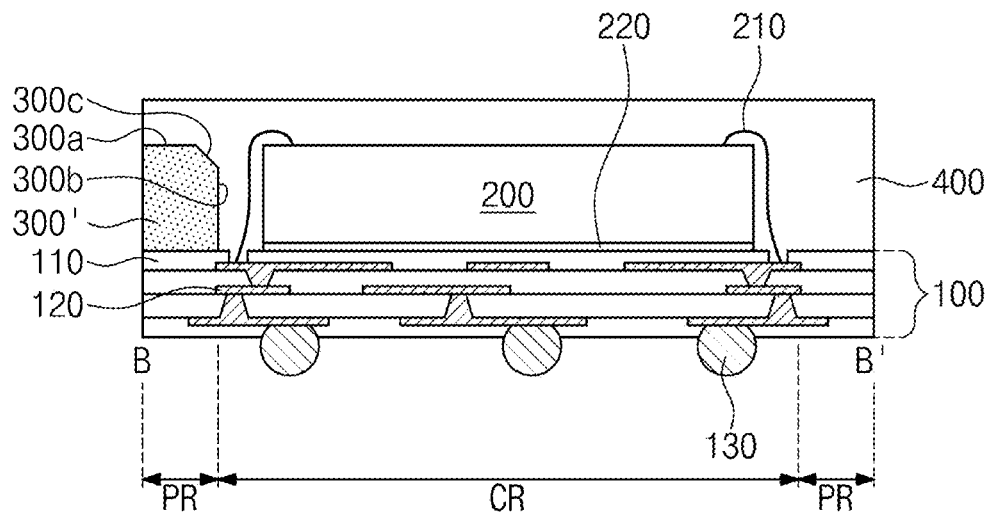
FIG. 2A is a cross-sectional view illustrating a semiconductor package according to some embodiments of the inventive concepts.
Figure 2B:
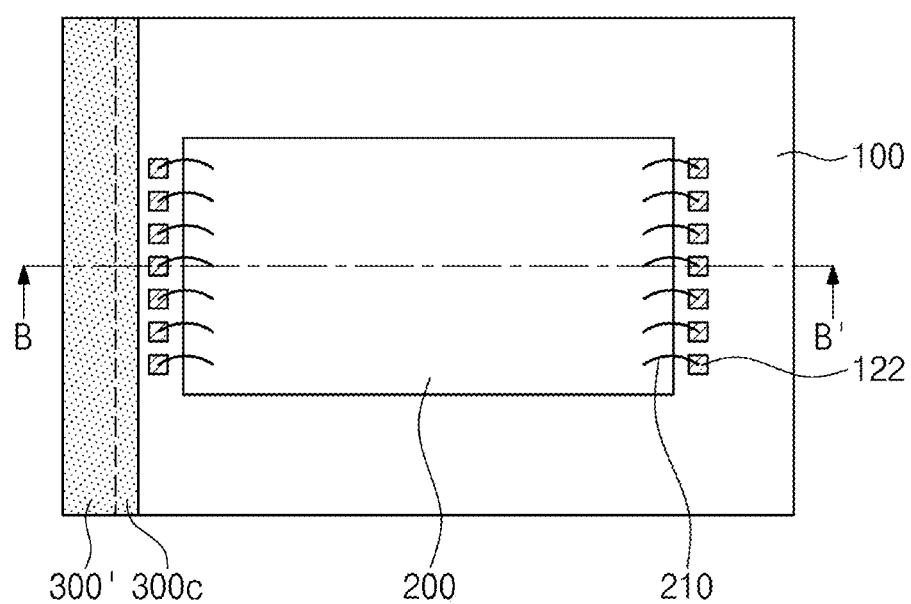
FIGS. 2B and 2C are plan views illustrating semiconductor packages according to some embodiments of the inventive concepts.
Figure 2C:
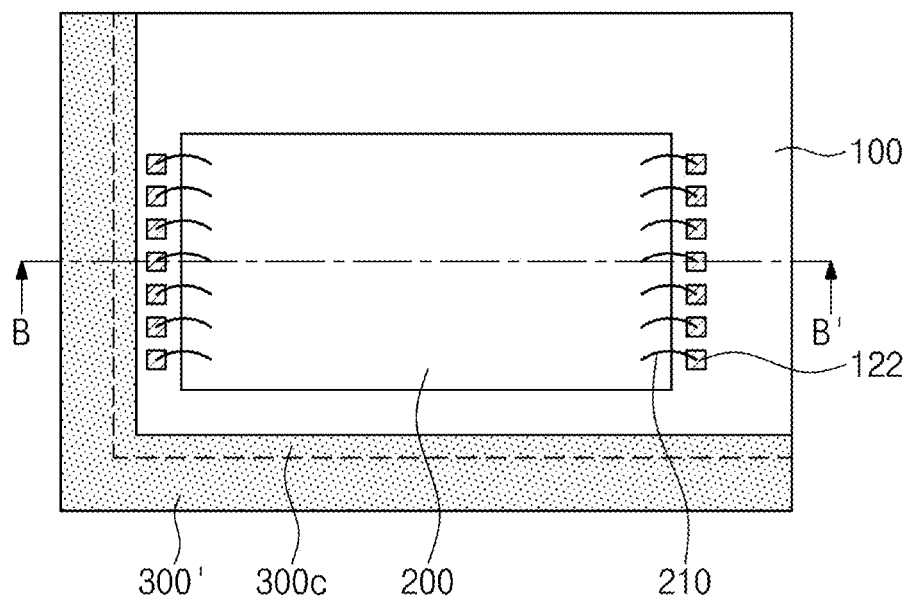

FIG. 2A is a cross-sectional view illustrating a semiconductor package according to some embodiments of the inventive concepts. FIGS. 2B and 2C are plan views illustrating semiconductor packages according to some embodiments of the inventive concepts. FIG. 2A corresponds to a cross-sectional view taken along lines B-B' of FIGS. 2B and 2C. In the following embodiments, the same components as in some embodiments of FIGS. 1A and 1B will be indicated by the same reference numerals or designators, and the descriptions thereto will be omitted or mentioned briefly for the purpose of ease and convenience in explanation. In other words, differences between the following embodiments and some embodiments of FIGS. 1A and 1B will be mainly described.

Referring to FIGS. 2A, 2B and 2C, a support structure 300' may be disposed on the package substrate 100. The support structure 300' may be disposed on the peripheral region PR. The support structure 300' may be disposed on a portion of the peripheral region PR. The support structure 300' may support the package substrate 100 to inhibit or prevent the package substrate 100 from being deformed. The support structure 300' may cover or face at least one sidewall 200b of the first semiconductor chip 200.

As illustrated in FIG. 2B, the support structure 300' may cover or face one sidewall 200b of the first semiconductor chip 200. The support structure 300' may be disposed at a side of the first semiconductor chip 200 and may have a line shape parallel to the one sidewall 200b of the first semiconductor chip 200, when viewed in a plan view. The support structure 300' may be spaced apart from the first semiconductor chip 200. A first inclined surface 300c of the support structure 300' may have a line shape parallel to the one sidewall 200b of the first semiconductor chip 200 when viewed in a plan view.

Alternatively, as illustrated in FIG. 2C, the support structure 300' may cover or face two adjacent sidewalls 200b of the first semiconductor chip 200. The support structure 300' may have a L-shape in a plan view, and the first semiconductor chip 200 may be located inside the support structure 300'. The support structure 300' may be spaced apart from the first semiconductor chip 200. A first inclined surface 300c of the support structure 300' may have a L-shape surrounding the two adjacent sidewalls 200b of the first semiconductor chip 200 when viewed in a plan view.

The support structure 300' may have the first inclined surface 300c disposed between the top surface 300a and the inner sidewall 300b facing the first semiconductor chip 200. The first inclined surface 300c may connect the top surface 300a and the inner sidewall 300b of the support structure 300'. The inner sidewall 300b of the support structure 300' may be perpendicular or substantially perpendicular to the top surface of the package substrate 100, and the first inclined surface 300c may be inclined with respect to the inner sidewall 300b of the support structure 300'.

Figure 3A:
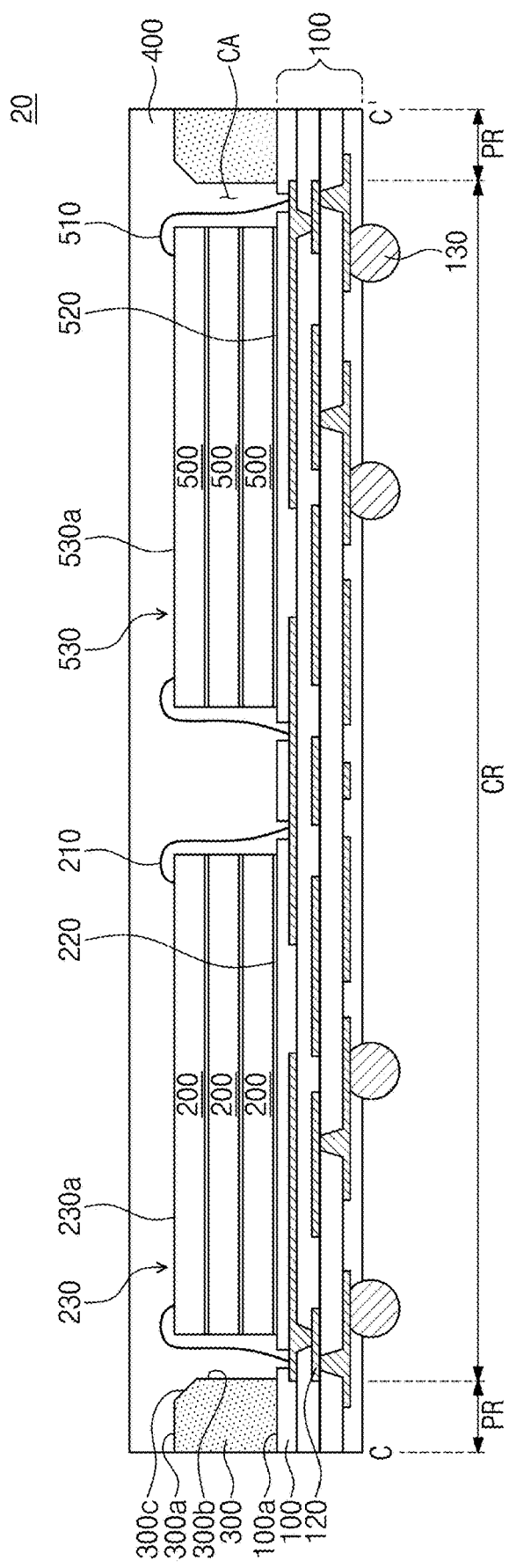
FIG. 3A is a cross-sectional view illustrating a semiconductor package according to some embodiments of the inventive concepts.
Figure 3B:
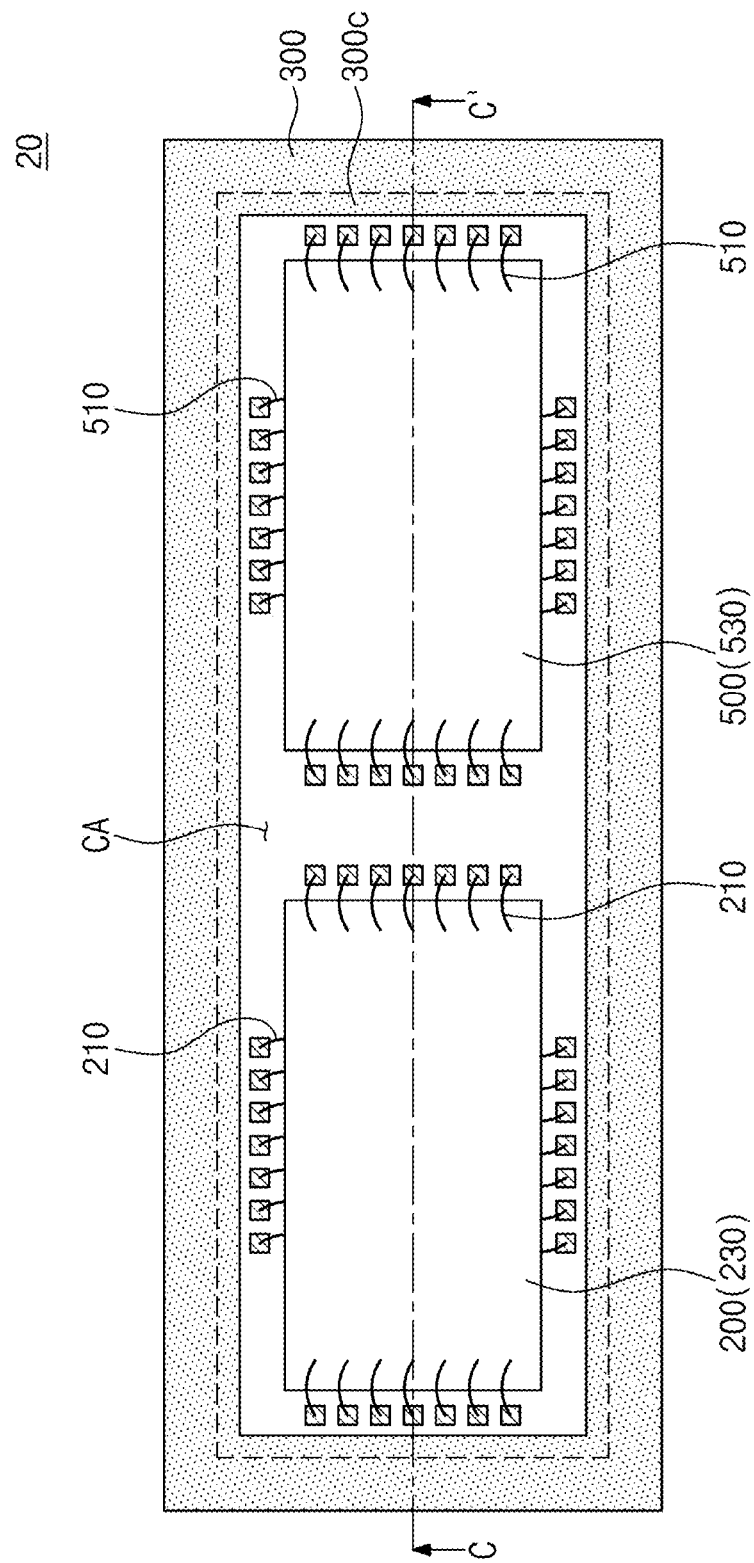
FIG. 3B is a plan view illustrating a semiconductor package according to some embodiments of the inventive concepts.

FIG. 3A is a cross-sectional view illustrating a semiconductor package 20 according to some embodiments of the inventive concepts. FIG. 3B is a plan view illustrating a semiconductor package 20 according to some embodiments of the inventive concepts. FIG. 3A corresponds to a cross-sectional view taken along a line C-C' of FIG. 3B.

Referring to FIGS. 3A and 3B, a plurality of semiconductor chips 200 and 500 may be disposed on a package substrate 100. For example, a first semiconductor chip 200 and a second semiconductor chip 500 may be mounted on a central region CR of the package substrate 100. The first semiconductor chip 200 and the second semiconductor chip 500 may be spaced apart from each other. The first semiconductor chip 200 and the second semiconductor chip 500 may be mounted by a wire bonding method. For example, the first semiconductor chip 200 may be electrically connected to the package substrate 100 through first bonding wires 210, and the second semiconductor chip 500 may be electrically connected to the package substrate 100 through second bonding wires 510. The first semiconductor chip 200 and the second semiconductor chip 500 may be adhered to the insulating layer 110 of the package substrate 100 through a first adhesive layer 220 and a second adhesive layer 520, respectively.

Each of the first and second semiconductor chips 200 and 500 may be a logic chip or a memory chip. For example, the first semiconductor chip 200 may be a logic chip, and the second semiconductor chip 500 may be a memory chip.

Alternatively, the first semiconductor chip 200 and the second semiconductor chip 500 may be the same kind of chips.

Each of the first semiconductor chip 200 and the second semiconductor chip 500 may be provided in plural. As illustrated in FIG. 3A, the plurality of first semiconductor chips 200 may be vertically stacked to constitute a first chip stack 230, and the plurality of second semiconductor chips 500 may be vertically stacked to constitute a second chip stack 530. In certain embodiments, one of the first semiconductor chip 200 and the second semiconductor chip 500 may be provided in plural. Alternatively, each of the first semiconductor chip 200 and the second semiconductor chip 500 may be provided in single.

A support structure 300 may be disposed on the package substrate 100. The support structure 300 may be disposed on a peripheral region PR of the package substrate 100. The support structure 300 may surround the central region CR along the peripheral region PR when viewed in a plan view. The first chip stack 230 and the second chip stack 530 may be provided in a cavity CA of the support structure 300, and the support structure 300 may surround the first chip stack 230 and the second chip stack 530 when viewed in a plan view. A top surface 300a of the support structure 300 may be located at the same level or substantially the same level as a top surface 230a of the first chip stack 230 and a top surface 530a of the second chip stack 530. Alternatively, the top surface 300a of the support structure 300 may be higher or lower than the top surface 230a of the first chip stack 230 and the top surface 530a of the second chip stack 530.

The support structure 300 may have a first inclined surface 300c disposed between a top surface 300a and an inner sidewall 300b of the support structure 300. The first inclined surface 300c may connect the top surface 300a and the inner sidewall 300b of the support structure 300. The inner sidewall 300b of the support structure 300 may be perpendicular or substantially perpendicular to the top surface 100a of the package substrate 100, and the first inclined surface 300c may be inclined with respect to the inner sidewall 300b of the support structure 300.

A molding layer 400 may be disposed on the package substrate 100. The molding layer 400 may cover the first chip stack 230, the second chip stack 530, and the support structure 300 on the central region CR and the peripheral region PR of the package substrate 100. The molding layer 400 may fill a space between the first chip stack 230 and the support structure 300, a space between the second chip stack 530 and the support structure 300, and a space between the first chip stack 230 and the second chip stack 530.

Figure 4A:
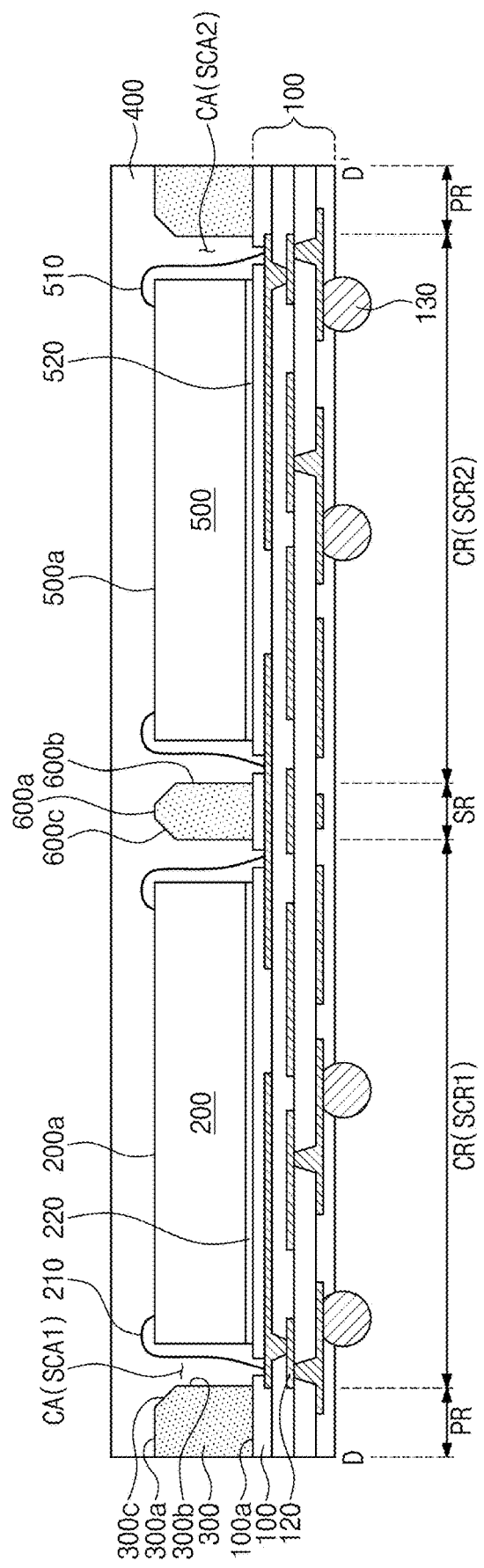
FIG. 4A is a cross-sectional view illustrating a semiconductor package according to some embodiments of the inventive concepts.
Figure 4B:
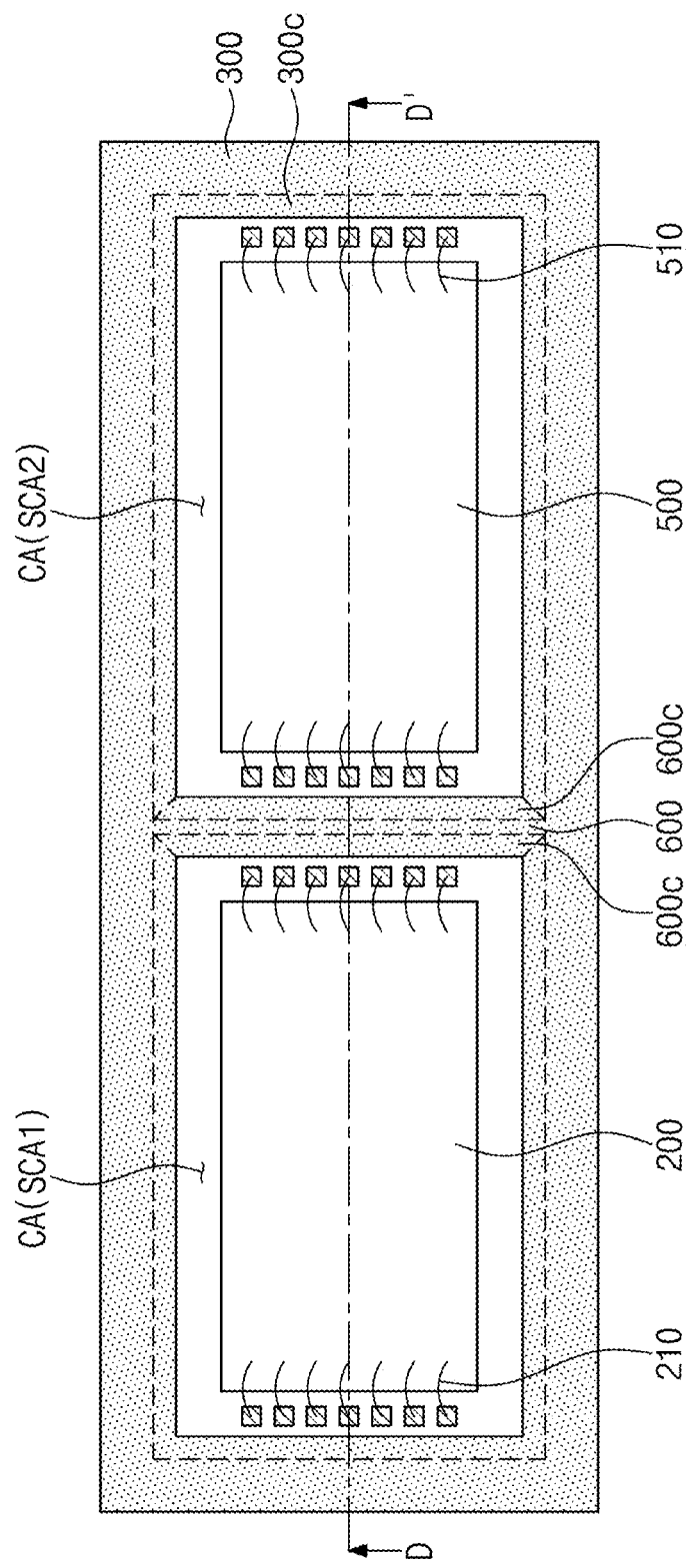
FIG. 4B is a plan view illustrating a semiconductor package according to some embodiments of the inventive concepts.

FIG. 4A is a cross-sectional view illustrating a semiconductor package according to some embodiments of the inventive concepts. FIG. 4B is a plan view illustrating a semiconductor package according to some embodiments of the inventive concepts. FIG. 4A corresponds to a cross-sectional view taken along a line D-D' of FIG. 4B.

Referring to FIGS. 4A and 4B, a package substrate 100 may include a central region CR, a peripheral region PR, and a separation region SR. The peripheral region PR may surround the central region CR when viewed in a plan view. The separation region SR may intersect the central region CR. In other words, the separation region SR may divide the central region CR, surrounded by the peripheral region PR, into two sub-regions SCR1 and SCR2.

A plurality of semiconductor chips 200 and 500 may be disposed on the package substrate 100. For example, a first semiconductor chip 200 and a second semiconductor chip 500 may be mounted on a central region CR of the package substrate 100. The first semiconductor chip 200 and the second semiconductor chip 500 may be disposed on the sub-regions SCR1 and SCR2, respectively. The first semiconductor chip 200 and the second semiconductor chip 500 may be mounted by a wire bonding method. Each of the first and second semiconductor chips 200 and 500 may be a logic chip or a memory chip.

A support structure 300 may be disposed on the package substrate 100. The support structure 300 may be disposed on the peripheral region PR. The support structure 300 may surround the central region CR along the peripheral region PR when viewed in a plan view. The first semiconductor chip 200 and the second semiconductor chip 500 may be provided in a cavity CA of the support structure 300, and the support structure 300 may surround the first semiconductor chip 200 and the second semiconductor chip 500 when viewed in a plan view. A top surface 300a of the support structure 300 may be located at the same level or substantially the same level as a top surface 200a of the first semiconductor chip 200 and a top surface 500a of the second semiconductor chip 500. Alternatively, the top surface 300a of the support structure 300 may be higher or lower than the top surface 200a of the first semiconductor chip 200 and the top surface 500a of the second semiconductor chip 500.

The support structure 300 may further include a separation structure 600. The separation structure 600 may be disposed on the separation region SR of the package substrate 100. The separation structure 600 may intersect the cavity CA. In other words, the separation structure 600 may divide the cavity CA in the support structure 300 into two sub-cavities SCA1 and SCA2. The separation structure 600 may separate or isolate the sub-regions SCR1 and SCR2 from each other. The separation structure 600 may cross between the first semiconductor chip 200 and the second semiconductor chip 500. In other words, the support structure 300 and the separation structure 600 may define regions on which the first and second semiconductor chips 200 and 500 are respectively mounted. The separation structure 600 may be spaced apart from the first and second semiconductor chips 200 and 500. A top surface 600a of the separation structure 600 may be located at the same level or substantially the same level as the top surface 200a of the first semiconductor chip 200 and the top surface 500a of the second semiconductor chip 500. Alternatively, the top surface 600a of the separation structure 600 may be higher or lower than the top surface 200a of the first semiconductor chip 200 and the top surface 500a of the second semiconductor chip 500. In addition, the top surface 600a of the separation structure 600 may be located at the same level or substantially the same level as the top surface 300a of the support structure 300.

The separation structure 600 may have second inclined surfaces 600c disposed between the top surface 600a and inner sidewalls 600b facing the sub-cavities SCA1 and SCA2. The second inclined surfaces 600c may connect the top surface 600a and the inner sidewalls 600b of the separation structure 600. The inner sidewalls 600b of the separation structure 600 may be perpendicular or substantially perpendicular to the top surface 100a of the package substrate 100, and the second inclined surfaces 600c may be inclined with respect to the inner sidewalls 600b of the separation structure 600. For example, the second inclined surfaces 600c may be inclined with respect to the top surface 100a of the package substrate 100. The second inclined surfaces 600c of the separation structure 600 may be located at the same level as the first inclined surface 300c of the support structure 300 and may be connected to the first inclined surface 300c.

In certain embodiments, the top surface 600a of the separation structure 600 may be located at a lower level than the top surface 300a of the support structure 300. For example, the top surface 300a of the support structure 300 may be located at the same level as or a higher level than the top surfaces 200a and 500a of the first and second semiconductor chips 200 and 500, and the top surface 600a of the separation structure 600 may be located at the same level as or a lower level than the top surfaces 200a and 500a of the first and second semiconductor chips 200 and 500. The second inclined surfaces 600c of the separation structure 600 may not be connected to the first inclined surface 300c of the support structure 300.

Figure 5:
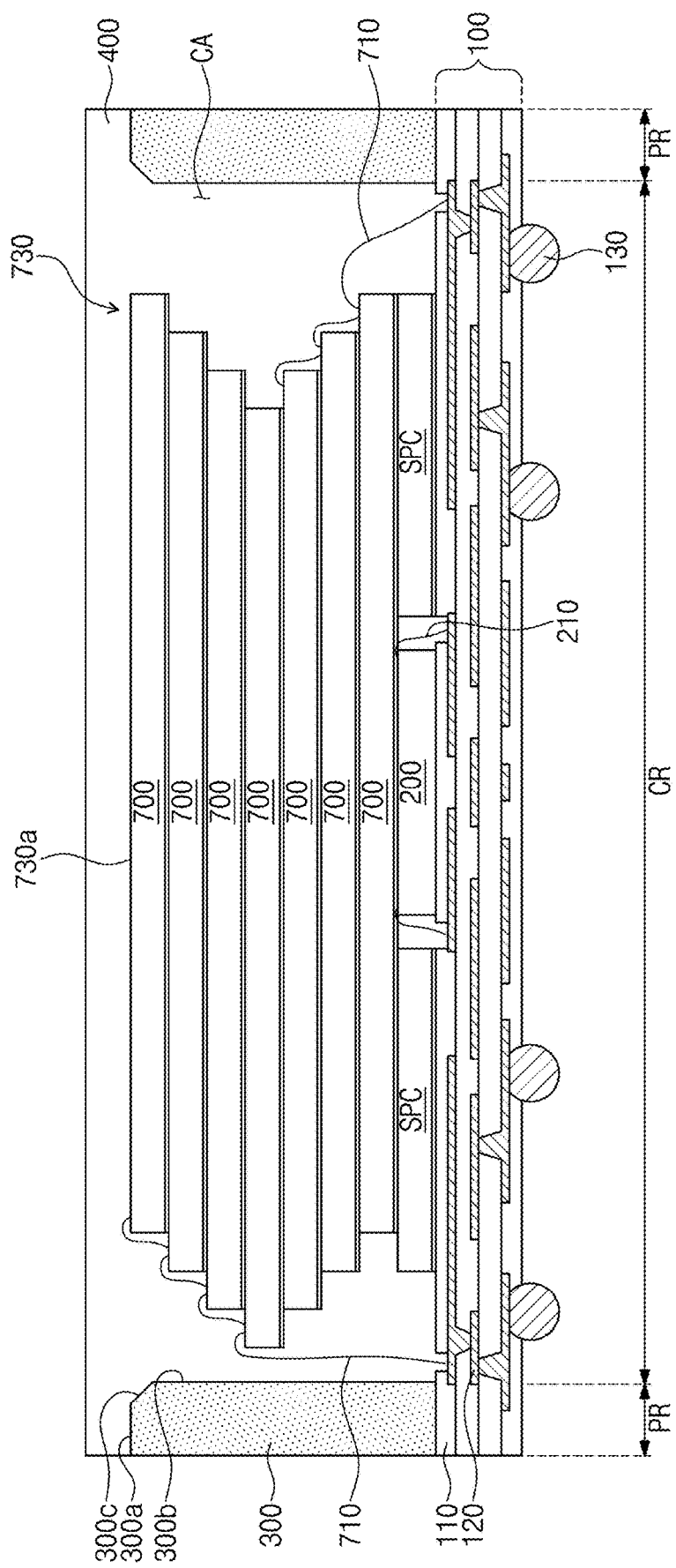
FIGS. 5 and 6 are cross-sectional views illustrating semiconductor packages according to some embodiments of the inventive concepts.

FIG. 5 is a cross-sectional view illustrating a semiconductor package according to some embodiments of the inventive concepts.

Referring to FIG. 5, a first semiconductor chip 200 may be disposed on a package substrate 100. The first semiconductor chip 200 may be mounted on a central region CR of the package substrate 100. The first semiconductor chip 200 may be mounted by a wire bonding method. The first semiconductor chip 200 may be adhered to the insulating layer 110 of the package substrate 100 through a first adhesive layer 220. The first semiconductor chip 200 may be electrically connected to the package substrate 100 through first bonding wires 210. The first semiconductor chip 200 may be a logic chip.

Spacer chips SPC may be disposed on the package substrate 100. The spacer chips SPC may be spaced apart from the first semiconductor chip 200 on the central region CR of the package substrate 100. Top surfaces of the spacer chips SPC may be located at the same level as a top surface of the first semiconductor chip 200. The spacer chips SPC may be dummy chips.

A third semiconductor chip 700 may be disposed on the first semiconductor chip 200. The third semiconductor chip 700 may be disposed on the first semiconductor chip 200 and the spacer chips SPC. The third semiconductor chip 700 may be supported by the first semiconductor chip 200 and the spacer chips SPC. The third semiconductor chip 700 may be provided in plural. For example, the plurality of third semiconductor chips 700 may be vertically stacked to constitute a third chip stack 730. The third semiconductor chips 700 may be mounted by a wire bonding method. The third semiconductor chips 700 may be electrically connected to the package substrate 100 through third bonding wires 710. The third semiconductor chips 700 may be memory chips.

A support structure 300 may be disposed on the package substrate 100. The support structure 300 may be disposed on a peripheral region PR of the package substrate 100. The support structure 300 may surround the central region CR along the peripheral region PR when viewed in a plan view. The first semiconductor chip 200, the spacer chips SPC and the third chip stack 730 may be provided in a cavity CA of the support structure 300, and the support structure 300 may surround the first semiconductor chip 200, the spacer chips SPC, and the third chip stack 730 when viewed in a plan view. A top surface 300a of the support structure 300 may be located at the same level or substantially the same level as a top surface 730a of the third chip stack 730. Alternatively, the top surface 300a of the support structure 300 may be higher or lower than the top surface 730a of the third chip stack 730.

A molding layer 400 may be disposed on the package substrate 100. The molding layer 400 may cover the first semiconductor chip 200, the spacer chips SPC, and the third chip stack 730, and the support structure 300 on the central region CR and the peripheral region PR of the package substrate 100.

Figure 6:
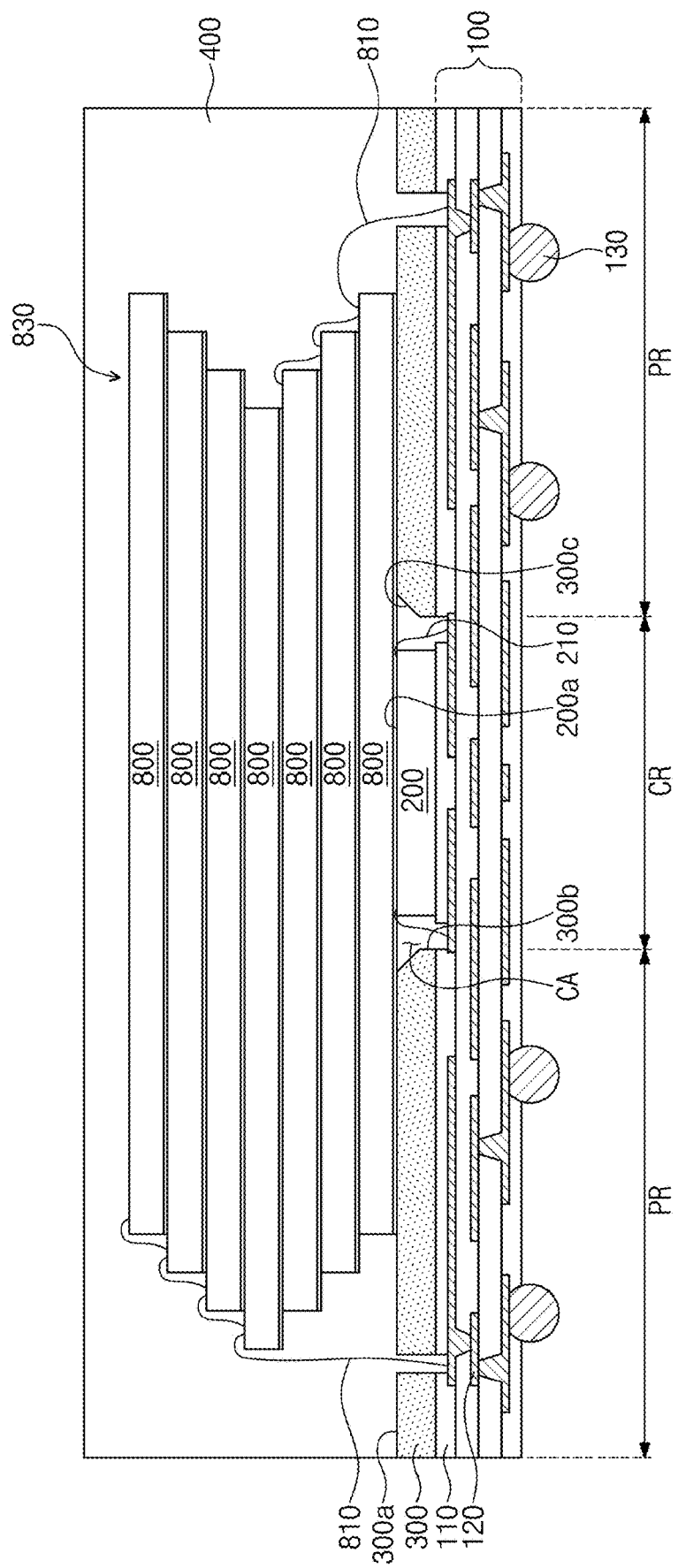

FIG. 6 is a cross-sectional view illustrating a semiconductor package according to some embodiments of the inventive concepts.

Referring to FIG. 6, a first semiconductor chip 200 may be disposed on a package substrate 100. The first semiconductor chip 200 may be mounted on a central region CR of the package substrate 100. The first semiconductor chip 200 may be mounted by a wire bonding method. The first semiconductor chip 200 may be a logic chip.

A support structure 300 may be disposed on the package substrate 100. The support structure 300 may be disposed on a peripheral region PR of the package substrate 100. The support structure 300 may surround the central region CR along the peripheral region PR when viewed in a plan view. The first semiconductor chip 200 may be provided in a cavity CA of the support structure 300, and the support structure 300 may surround the first semiconductor chip 200 when viewed in a plan view. A top surface 300a of the support structure 300 may be located at the same level or substantially the same level as a top surface 200a of the first semiconductor chip 200.

A fourth semiconductor chip 800 may be disposed on the first semiconductor chip 200. The fourth semiconductor chip 800 may be disposed on the first semiconductor chip 200 and the support structure 300. In other words, the fourth semiconductor chip 800 may cover the central region CR and may overlap with a portion of the peripheral region PR. The fourth semiconductor chip 800 may be supported by the first semiconductor chip 200 and the support structure 300. The fourth semiconductor chip 800 may be provided in plural. For example, the plurality of fourth semiconductor chips 800 may be vertically stacked to constitute a fourth chip stack 830. The fourth semiconductor chips 800 may be mounted by a wire bonding method. The fourth semiconductor chips 800 may be electrically connected to the package substrate 100 through fourth bonding wires 810. At least some of the fourth bonding wires 810 may penetrate the support structure 300 and the insulating layer 110 of the package substrate 100 so as to be connected to the interconnection layer 120 of the package substrate 100. The fourth semiconductor chips 800 may be memory chips.

A molding layer 400 may be disposed on the package substrate 100. The molding layer 400 may cover the first semiconductor chip 200, the fourth chip stack 830, and the support structure 300 on the central region CR and the peripheral region PR of the package substrate 100.

Figure 7:
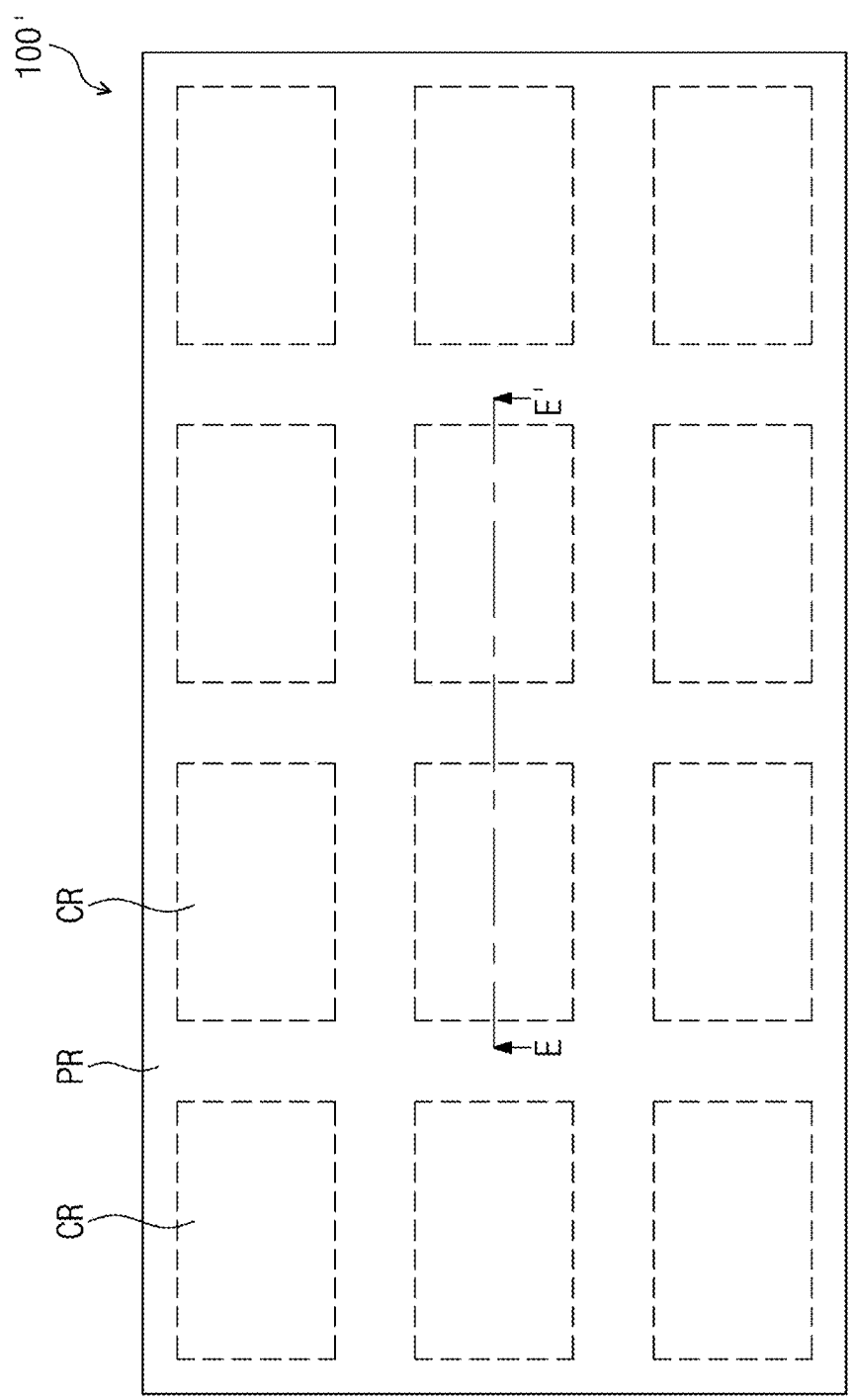
FIGS. 7 to 15 are views illustrating a method for manufacturing a semiconductor package according to some embodiments of the inventive concepts.
Figure 8:
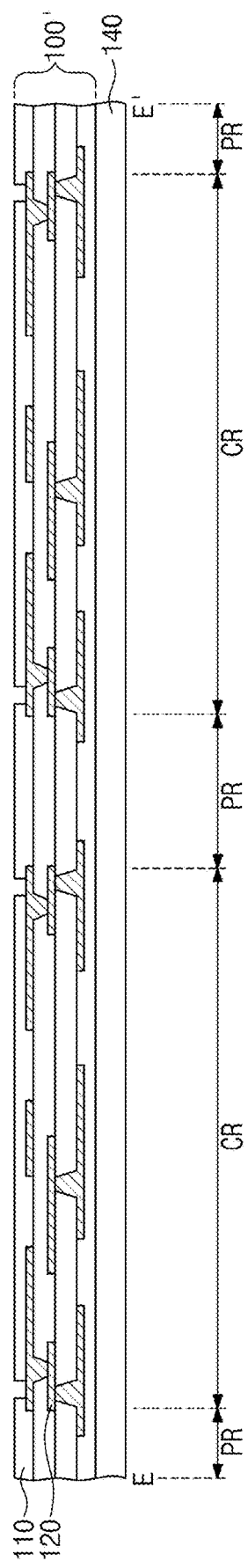
Figure 9:
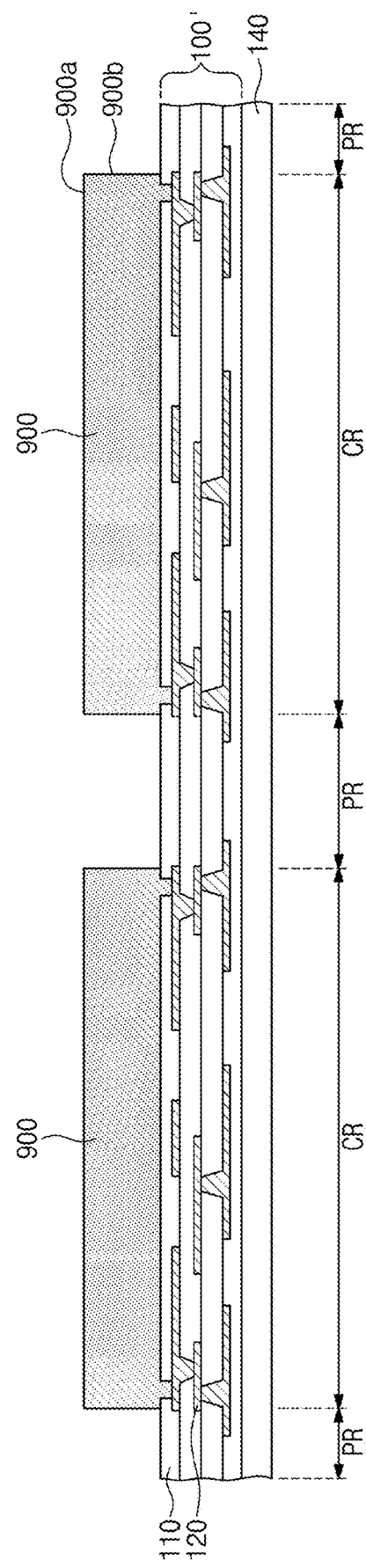
Figure 10:
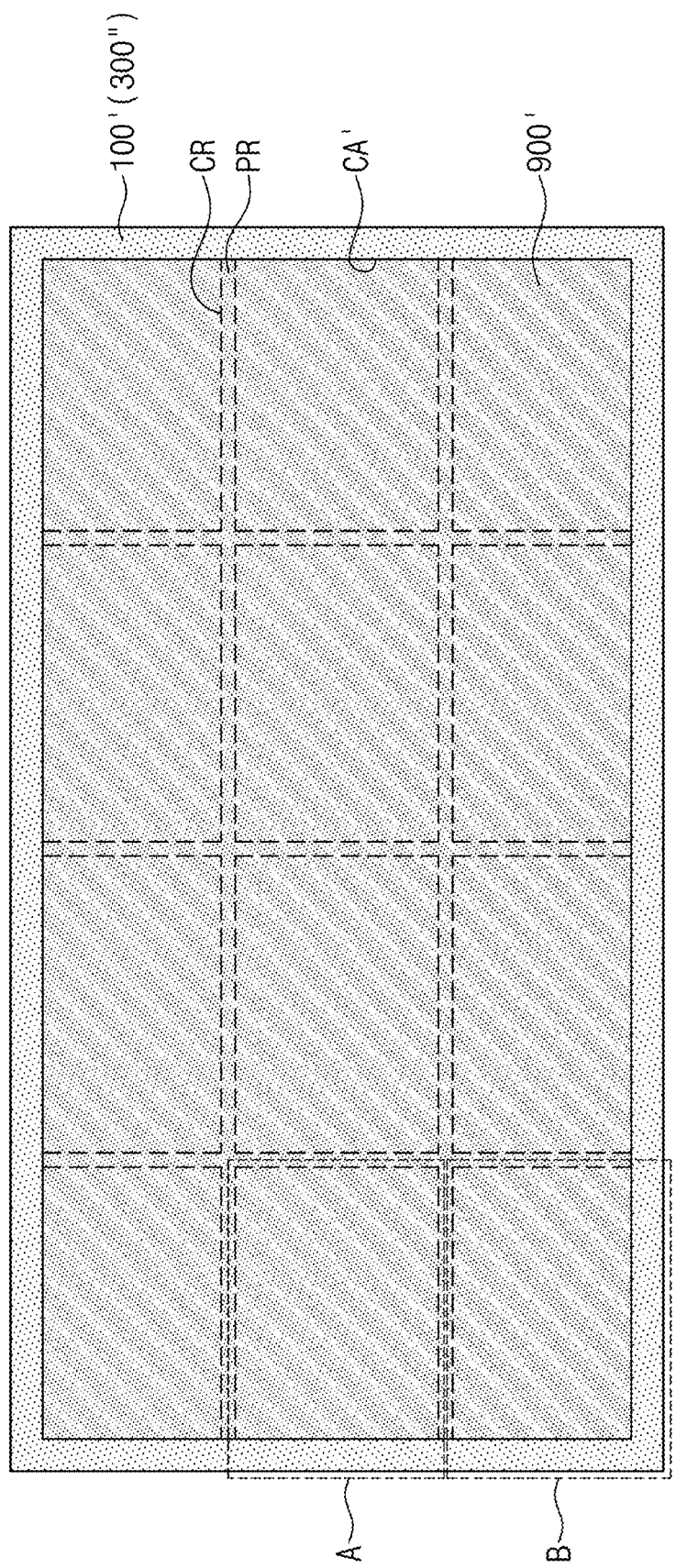
Figure 11:
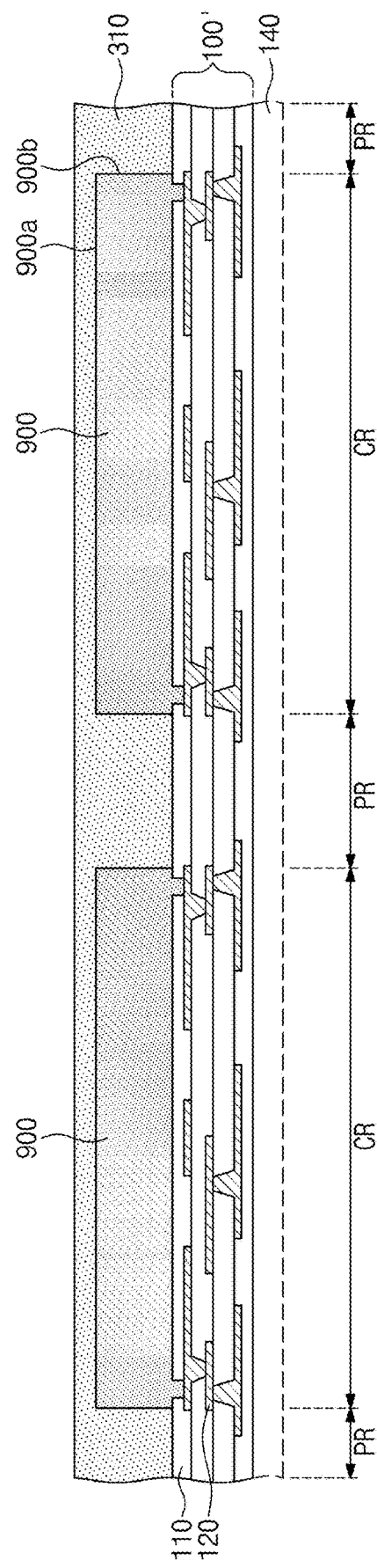
Figure 12:
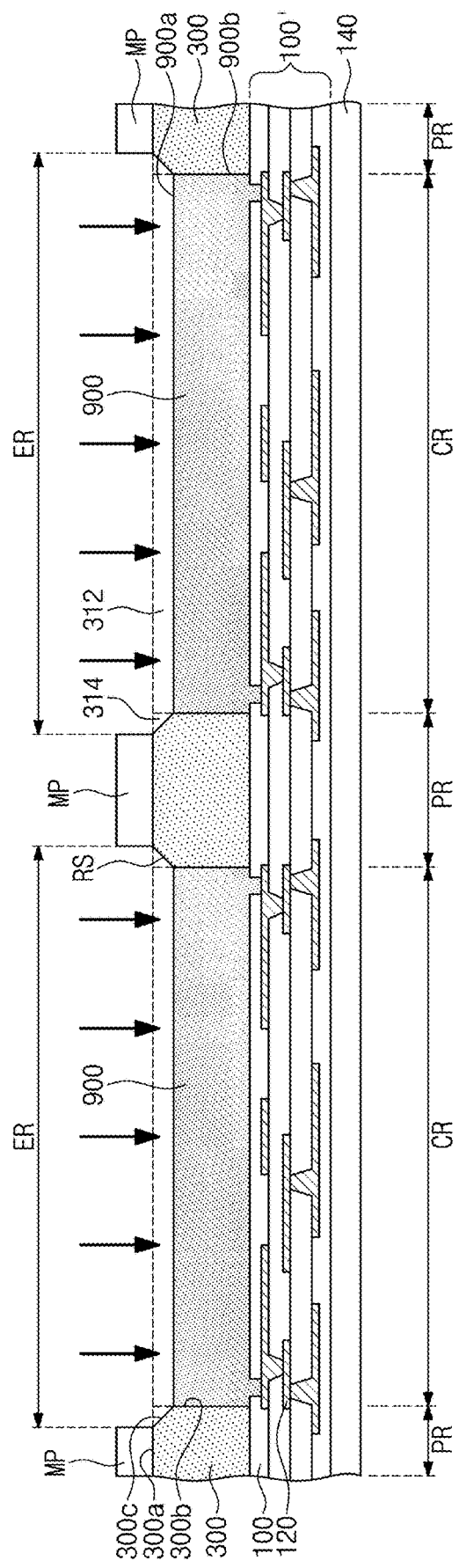
Figure 13:
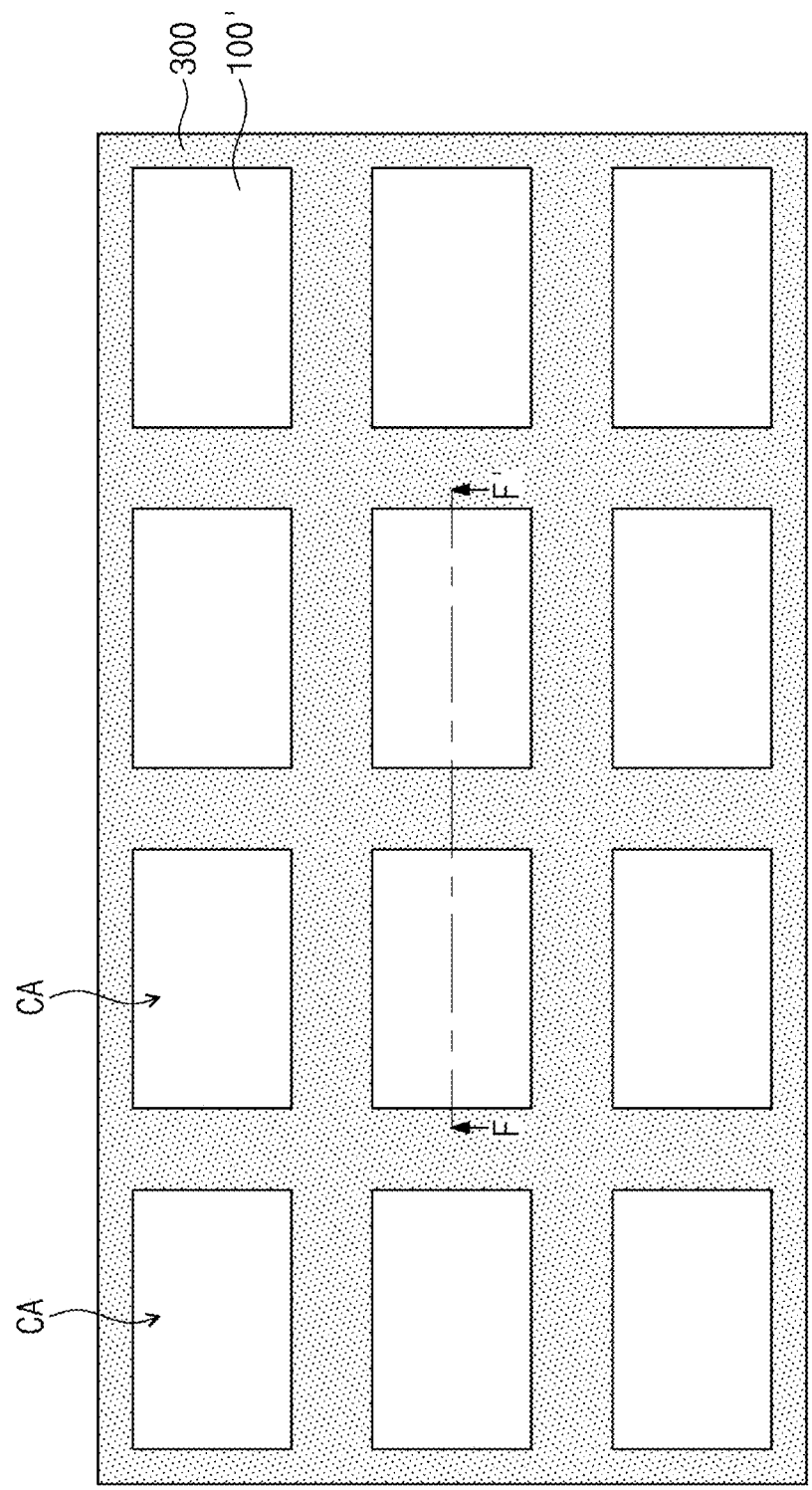

FIGS. 7 to 15 are views illustrating a method for manufacturing a semiconductor package according to some embodiments of the inventive concepts. FIGS. 7, 10 and 13 are plan views, and FIGS. 8, 9, 11, 12, 14 and 15 are cross-sectional views. FIG. 8 corresponds to a cross-sectional view taken along a line E-E' of FIG. 7, and FIG. 14 corresponds to a cross-sectional view taken along a line F-F' of FIG. 15.

Referring to FIGS. 7 and 8, a substrate 100' may be provided. The substrate 100' may include a central region CR and a peripheral region PR surrounding the central region CR. The substrate 100' may be a substrate for forming a plurality of packages at the same time. For example, as illustrated in FIG. 7, the substrate 100' may include a plurality of the central regions CR, and the peripheral region PR may surround each of the central regions CR. The substrate 100' may be divided into package substrates 100 (see FIG. 1A) by a subsequent sawing process. The substrate 100' may include a printed circuit board (PCB). The substrate 100' may have a structure in which insulating layers 110 and interconnection layers 120 are alternately stacked. A total thickness of the substrate 100' including the insulating layers 110 and the interconnection layers 120 may be greater than 10 μm and less than 80 μm.

A carrier substrate 140 may be provided under the substrate 100'. The carrier substrate 140 may be adhered to a bottom surface of the substrate 100' through a carrier adhesive layer. The carrier substrate 140 may support the substrate 100' from below.

Referring to FIG. 9, sacrificial structures 900 may be formed on the substrate 100'. The sacrificial structures 900 may be provided on the central regions CR of the substrate 100', respectively. For example, a sacrificial layer may be formed to cover the substrate 100', and then, the sacrificial layer may be patterned to form the sacrificial structures 900. At this time, sidewalls 900b of the sacrificial structures 900 may be perpendicular or substantially perpendicular to a top surface of the substrate 100'. Planar shapes of the sacrificial structures 900 may correspond to planar shapes of semiconductor chips 200 (see FIG. 1B or 15) to be mounted later on the substrate 100', and a height of the sacrificial structures 900 may be equal to or less than a height of the semiconductor chips 200. The sacrificial structures 900 may include a photosensitive material. For example, the sacrificial structures 900 may include a dry film resist (DFR) and/or a photo imageable dielectric (PID).

In certain embodiments, a single sacrificial structure 900' may be formed on the substrate 100'. As illustrated in FIG. 10, the single sacrificial structure 900' may overlap with the plurality of central regions CR. In other words, the sacrificial structure 900' may cover the plurality of central regions CR and a portion of the peripheral region PR disposed between the central regions CR. Hereinafter, some embodiments of FIG. 9 will be described as an example.

Referring to FIG. 11, a support layer 310 may be formed on the substrate 100'. The support layer 310 may be formed on the central regions CR and the peripheral region PR of the substrate 100'. The support layer 310 may cover the sacrificial structures 900. For example, the support layer 310 may be in contact with top surfaces 900a and sidewalls 900b of the sacrificial structures 900. A height of the support layer 310 may be equal to the height of the semiconductor chips 200 (see FIG. 1A or 15) to be mounted later on the substrate 100'. Alternatively, the height of the support layer 310 may be higher or lower than the height of the semiconductor chips 200. The support layer 310 may be formed by applying an insulating material onto the substrate 100'. The insulating material may have an etch selectivity with respect to the sacrificial structures 900. The insulating material may include an ajinomoto build-up film (ABF) or a resin-coated copper (RCC).

The substrate 100' having a thin thickness may be bent or warped in various processes for forming a semiconductor package, e.g., a process of transferring a substrate, an etching process performed on the substrate, a deposition process, and/or a chip mounting process. The support layer 310 may be disposed on the substrate 100' to support the substrate 100'. Thus, the support layer 310 may reduce or prevent the substrate 100' from being bent or warped in the processes. As a result, defects or failure occurring in processes for forming a semiconductor package may be reduced.

Thereafter, the carrier substrate 140 may be removed.

Referring to FIG. 12, a mask pattern MP may be formed on the support layer 310 (see FIG. 11). The mask pattern MP may be formed on the peripheral region PR to expose the central regions CR. At this time, exposure regions ER exposed by the mask pattern MP may be larger than the central regions CR, in consideration of process dispersion or process error in an etching process to be described later. For example, the central regions CR may be located in the exposure regions ER when viewed in a plan view. In other words, the mask pattern MP may expose the central regions CR, and portions of the peripheral region PR which are adjacent to the central regions CR. An inner sidewall of the mask pattern MP may be horizontally spaced apart from the central regions CR.

An etching process may be performed on the support layer 310 (see FIG. 11) to form a support structure 300. The etching process may be performed using the mask pattern MP as an etch mask. The etching process may include an anisotropic etching process. For example, the etching process may include a sand blast process. The support layer 310 may be etched by the etching process to form recesses RS in the exposure regions ER. The recess RS may be formed by removing a first portion 312 and a second portion 314 of the support layer 310. The first portion 312 of the support layer 310 may be disposed on each of the sacrificial structures 900, and the second portion 314 of the support layer 310 may be disposed between the sacrificial structure 900 and the mask pattern MP. Thus, the top surfaces 900a of the sacrificial structures 900 may be exposed. At this time, due to process dispersion or error of the etching process, an etching depth of the second portion 314 may decrease as a distance from the mask pattern MP decreases. Thus, inner sidewalls of the recesses RS (e.g., an inclined surface 300c of the support structure 300 formed by the removal of the second portion 314) may be inclined with respect to the top surfaces 900a of the sacrificial structures 900 and the sidewall of the mask pattern MP.

In certain embodiments, as illustrated in FIG. 10, the single sacrificial structure 900' may be formed to cover the central regions CR, and then, a portion of a support layer covering the sacrificial structure 900' may be etched. The support layer may be etched by the etching process, and thus a support structure 300" may be formed. At this time, the sacrificial structure 900' may be exposed. The support structure 300" may surround all of the plurality of central regions CR when viewed in a plan view. Hereinafter, some embodiments of FIG. 12 will be described.

Figure 14:
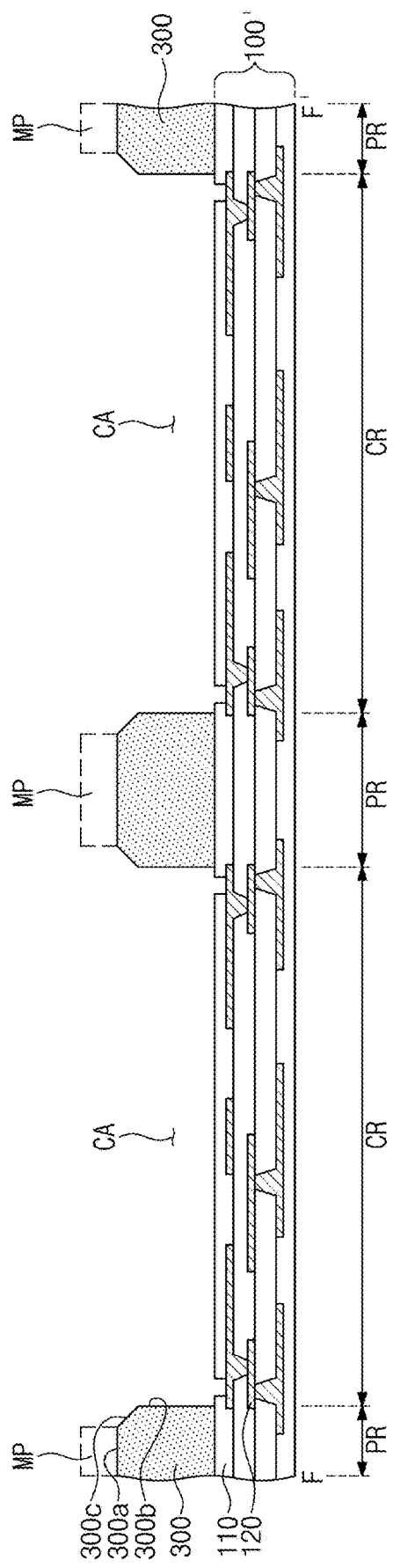

Referring to FIGS. 13 and 14, the mask pattern MP may be removed. Thus, a top surface 300a of the support structure 300 may be exposed.

The sacrificial structures 900 (see FIG. 12) may be removed. The sacrificial structures 900 may be removed using a wet etching process. The sacrificial structures 900 may have an etch selectivity with respect to the support structure 300 and the substrate 100', and thus the support structure 300 may not be removed during the wet etching process. In detail, as illustrated in FIGS. 13 and 14, the sacrificial structures 900 may be removed to form cavities CA in the support structure 300. The cavities CA may be located on the central regions CR. Each of the cavities CA may be a region in which each of semiconductor chips 200 (see FIG. 15) will be mounted in a subsequent process. Since the sidewalls 900b of the sacrificial structures 900 are perpendicular or substantially perpendicular to the top surface of the substrate 100', inner sidewalls of the cavities CA (e.g., inner sidewalls 300b of the support structure 300) may be perpendicular or substantially perpendicular to the top surface of the substrate 100'.

An insulating material (e.g., a support layer) may be formed on a substrate, and then, a cavity of a support structure may be formed by etching the support layer. In example embodiments, an inner sidewall of the cavity may be inclined, etch residues may be accumulated on the substrate and in the cavity, and/or the inner sidewall of the cavity may be concave. For example, if the support layer is etched by a sand blast process, the inner sidewall of the cavity may be inclined. Alternatively, if the support layer is etched by the sand blast process or a laser grooving process, residues occurring in the etching process may be adhered to the inner sidewall of the cavity and the top surface of the substrate. Alternatively, if the support layer is etched by a wet etching process, the inner sidewall of the cavity may be concavely formed (e.g., round-etched), and the substrate may be damaged by an etching solution.

However, according to some embodiments of the inventive concepts, the sacrificial structures 900 having the sidewalls 900b perpendicular or substantially perpendicular to the top surface of the substrate 100' may be formed, the support layer 310 may be formed to surround the sacrificial structures 900, and then, the sacrificial structures 900 may be removed to form the support structure 300. Thus, the inner sidewall of the cavity CA (e.g., the inner sidewall 300b of the support structure 300) may be perpendicular or substantially perpendicular to the top surface of the substrate 100'.

In addition, limitations on a material of the sacrificial structures 900 may be less unlike the support structure 300 formed of a high-strength material to support the substrate 100'. For example, the sacrificial structures 900 may be formed of a material having a great etch selectivity with respect to the substrate 100'. The cavities CA of the support structure 300 may be formed by wet-etching the sacrificial structures 900. Thus, in the etching process, a residue may not be generated and the substrate 100' may not be damaged.

Furthermore, shapes of the cavities CA of the support structure 300 may be formed depending on shapes of the sacrificial structures 900, and thus the cavities CA may be easily formed in various desired shapes.

Figure 15:
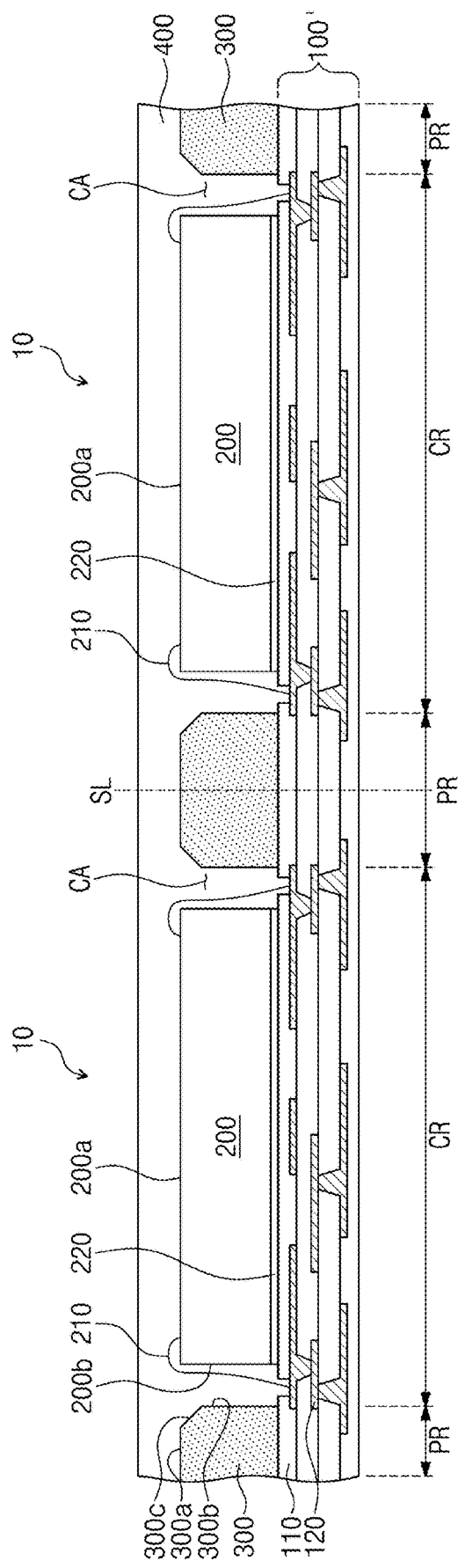

Referring to FIG. 15, semiconductor chips 200 may be mounted on the substrate 100'. The semiconductor chips 200 may be disposed in the cavities CA of the support structure 300. The semiconductor chips 200 may be adhered onto the central regions CR of the substrate 100' by using adhesive layers 220. The semiconductor chips 200 may be mounted on the substrate 100' through bonding wires 210. A distance between the inner sidewall 300b of the support structure 300 and each of the semiconductor chips 200 may range from 1 μm to 10 μm. If the distance between the support structure 300 and the semiconductor chip 200 is less than 1 μm, it may be difficult to provide a molding material into a space between the support structure 300 and the semiconductor chip 200 in a subsequent process. However, embodiments of the inventive concepts are not limited thereto. In certain embodiments, the distance between the inner sidewall 300b of the support structure 300 and each of the semiconductor chips 200 may be greater than 10 μm.

In FIG. 15, one semiconductor chip 200 is mounted on one central region CR. However, embodiments of the inventive concepts are not limited thereto. In certain embodiments, a plurality of semiconductor chips may be mounted on one central region. In example embodiments, the semiconductor package 20 according to some embodiments of FIGS. 3A and 3B may be manufactured. Hereinafter, some embodiments of FIG. 15 will be described.

A molding layer 400 may be formed on the substrate 100'. The molding layer 400 may be formed by applying a molding material onto the substrate 100'. At this time, the molding material may fill spaces between the support structure 300 and the semiconductor chips 200.

If residues are generated and accumulated on a substrate and in a cavity in a general process of forming the cavity of a support structure and/or an inner sidewall of the cavity is concave, it may be difficult to provide a molding material into spaces between the support structure and semiconductor chips. In example embodiments, a hollow (e.g., an air gap) may be formed between a substrate and a molding layer and/or impurities (e.g., the residues) may remain in the molding layer. Thus, defects or failure of a semiconductor package may be caused.

However, according to some embodiments of the inventive concepts, the inner sidewall of the cavity CA (e.g., the inner sidewall 300b of the support structure 300) may be formed to be perpendicular or substantially perpendicular to the top surface of the substrate 100', and the space between the support structure 300 and the semiconductor chip 200 may have a uniform or substantially uniform width. Thus, the molding material may be easily provided into the spaces between the support structure 300 and the semiconductor chips 200, and defects or failure of the semiconductor package may be reduced or minimized.

Referring to FIGS. 1A, 1B and 15, a singulation process may be performed on the resultant structure of FIG. 15. For example, the molding layer 400, the support structure 300 and the substrate 100' may be cut to separate semiconductor packages 10 from each other. In other words, the molding layer 400, the support structure 300 and the substrate 100' may be sawed along a sawing line SL located between the semiconductor chips 200, and thus the semiconductor chips 200 may be separated from each other. The semiconductor package 10 of FIGS. 1A and 1B may be manufactured by the processes described above.

In certain embodiments, as illustrated in FIG. 10, the support structure 300" may be formed to surround all of the plurality of central regions CR. The support structure 300" may surround the single sacrificial structure 900' formed on the plurality of central regions CR. The sacrificial structure 900' may be removed to form a single cavity CA'. Semiconductor chips may be mounted on the substrate 100'. The semiconductor chips may be disposed in the cavity CA' of the support structure 300", and each of the semiconductor chips may be disposed on each of the central regions CR. A molding layer may be formed on the substrate 100'. The molding layer may fill a space between the support structure 300" and the semiconductor chips and a space between the semiconductor chips. The molding layer, the support structure 300" and the substrate 100' may be cut to separate semiconductor packages from each other. At this time, a semiconductor package of a region 'A' of FIG. 10 may be the semiconductor package of FIGS. 2A and 2B, and a semiconductor package of a region 'B' of FIG. 10 may be the semiconductor package of FIGS. 2A and 2C.

According to some embodiments of the inventive concepts, the support structure may support the package substrate to reduce or prevent the package substrate from being deformed, and thus the structural stability of the semiconductor package may be improved.

In the method for manufacturing a semiconductor package according to some embodiments of the inventive concepts, the support layer and the support structure formed using the support layer may support the substrate on the substrate and may reduce or prevent the substrate having a thin thickness from being bent or warped in various processes for forming the semiconductor package. As a result, defects or failure occurring in processes for forming the semiconductor package may be reduced.

In addition, in the etching process for forming the cavity, a residue may not be generated and the substrate may not be damaged. Moreover, the shapes of the cavities of the support structure may be determined by the shapes of the sacrificial structures, and thus the cavities may be easily formed in various desired shapes. Furthermore, the molding material may be easily provided into the spaces between the support structure and the semiconductor chips, and defects or failure of the semiconductor package may be reduced or minimized.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
   a package substrate;
   a support structure on the package substrate and having a cavity therein; and
   at least one first semiconductor chip on the package substrate in the cavity,
   wherein the support structure includes a first inner sidewall facing the cavity, a first top surface, and a first inclined surface connecting the first inner sidewall and the first top surface,
   wherein the first inclined surface is inclined with respect to a top surface of the at least one first semiconductor chip, and
   wherein the first inner sidewall of the support structure is substantially perpendicular to a top surface of the package substrate.

2. The semiconductor package of claim 1, wherein a contact point of the first inner sidewall and the first inclined surface of the support structure is at a lower level than the top surface of the at least one first semiconductor chip.

3. The semiconductor package of claim 1, wherein the first top surface of the support structure is at substantially the same level as the top surface of the at least one first semiconductor chip.

4. The semiconductor package of claim 1, wherein a distance between the first inner sidewall of the support structure and the at least one first semiconductor chip ranges from 1 µm to 1 µm.

5. The semiconductor package of claim 1, wherein the at least one first semiconductor chip is connected to the package substrate by a bonding wire, and
   wherein the bonding wire is spaced apart from the support structure between the first semiconductor chip and the support structure.

6. The semiconductor package of claim 1, wherein the support structure further comprises: a separation structure on the package substrate to divide the cavity into a plurality of sub-cavities,
   wherein the at least one first semiconductor chip is a plurality of first semiconductor chips, and
   wherein the plurality of first semiconductor chips are in the plurality of sub-cavities, respectively.

7. The semiconductor package of claim 6, wherein the separation structure includes, second inner sidewalls facing each of the sub-cavities, a second top surface, and second inclined surfaces connecting the second inner sidewalls and the second top surface, and
   wherein each of the second inclined surfaces are inclined with respect to top surfaces of the plurality of first semiconductor chips.

8. The semiconductor package of claim 7, wherein the second top surface of the separation structure is at substantially the same level as the first top surface of the support structure, and
   wherein the second inclined surfaces of the separation structure is at substantially the same level as the first inclined surface of the support structure and is connected to the first inclined surface.

9. The semiconductor package of claim 1, further comprising:
   a second semiconductor chip on the at least one first semiconductor chip and mounted to the package substrate.

10. The semiconductor package of claim 9, wherein the second semiconductor chip is in the cavity, and
    wherein the first top surface of the support structure is at substantially the same level as a top surface of the second semiconductor chip.

11. The semiconductor package of claim 9, wherein the first top surface of the support structure is at substantially the same level as the top surface of the at least one first semiconductor chip, and
    wherein the second semiconductor chip is on the at least one first semiconductor chip and the support structure.

12. The semiconductor package of claim 1, further comprising:
    a molding layer covering the at least one first semiconductor chip and the support structure on the package substrate,
    wherein the molding layer fills a space between the support structure and the at least one first semiconductor chip.

13. A method for manufacturing a semiconductor package, the method comprising:
    forming sacrificial structures spaced apart from each other on a substrate;
    forming a support layer covering the sacrificial structures on the substrate;
    performing an anisotropic etching process on the support layer to form support structures by forming recesses exposing top surfaces of the sacrificial structures;
    removing the sacrificial structures to form cavities surrounded by respective ones of the support structures, each of the support structures including an inner sidewall facing a corresponding one of the cavities, a top surface, and an inclined surface connecting the inner sidewall and the top surface;
    disposing semiconductor chips in the cavities, respectively; and
    forming a molding layer on the semiconductor chips, Wherein the disposing disposes the semiconductor chips in the cavities a distance between each of the semiconductor chips and a corresponding one of the support structures is substantially constant from the top surface of the substrate to a specific height, and gradually increases from the specific height toward the top surface of the corresponding one of the support structures.

14. The method of claim 13, wherein sidewalls of the sacrificial structures are perpendicular to the top surface of the substrate.

15. The method of claim 13, wherein, after the performing of the anisotropic etching process, inner sidewalls of the recesses are inclined with respect to the top surfaces of the sacrificial structures and sidewalls of the sacrificial structures.

16. The method of claim 13, further comprising:
after the forming of the molding layer, cutting the molding layer, the support layer and the substrate to separate the semiconductor chips from each other.

17. The method of claim 13, wherein the molding layer fills spaces between the support layer having the cavities and the semiconductor chips.

18. A semiconductor package comprising:
a package substrate including a central region and a peripheral region surrounding the central region;
a semiconductor chip on the central region of the package substrate;
a support structure on the peripheral region of the package substrate and surrounding at least two sidewalls of the semiconductor chip;
a molding layer covering the semiconductor chip and the support structure on the package substrate and filling a space between the semiconductor chip and the support structure; and
external terminals on a bottom surface of the package substrate,
wherein the sidewalls of the semiconductor chip are substantially perpendicular to a top surface of the package substrate, and
wherein a distance between the semiconductor chip and the support structure is substantially constant from the top surface of the package substrate to a specific height and gradually increases from the specific height toward a top surface of the support structure.

19. The semiconductor package of claim 18, wherein the support structure has: an inner sidewall facing the semiconductor chip; the top surface; and an inclined surface connecting the inner sidewall and the top surface, and
wherein the inclined surface is inclined with respect to a top surface of the semiconductor chip.

* * * * *